United States Patent
Bao et al.

(10) Patent No.: US 8,685,788 B2
(45) Date of Patent: Apr. 1, 2014

(54) NANOWIRE TUNNELING FIELD EFFECT TRANSISTOR WITH VERTICAL STRUCTURE AND A MANUFACTURING METHOD THEREOF

(75) Inventors: Weining Bao, Shanghai (CN); Chengwei Cao, Shanghai (CN); Pengfei Wang, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/528,398

(22) Filed: Jun. 20, 2012

(65) Prior Publication Data

US 2013/0092902 A1 Apr. 18, 2013

(30) Foreign Application Priority Data

Oct. 13, 2011 (CN) .......................... 2011 1 0309367

(51) Int. Cl.
*H01L 21/16* (2006.01)
(52) U.S. Cl.
USPC ........... 438/104; 438/163; 438/197; 438/212; 438/962; 257/E21.409
(58) Field of Classification Search
USPC ............... 257/43, E29.07, E21.409; 438/962, 438/104, 163, 197, 212; 977/762, 811
See application file for complete search history.

(56) References Cited

U.S. PATENT DOCUMENTS

2008/0293246 A1* 11/2008 Cohen et al. .................. 438/682

OTHER PUBLICATIONS

Ng et al., "Single Crystal Nanowire Vertical Surround-Gate Field-Effect Transistor", 2004, Nano Letters, vol. 4, No. 7, pp. 1247-1252.*

* cited by examiner

*Primary Examiner* — Kenneth Parker
*Assistant Examiner* — Jose R Diaz
(74) *Attorney, Agent, or Firm* — Merchant & Gould P.C.

(57) ABSTRACT

The present invention belongs to the technical field of semiconductor devices and specifically relates to a method for manufacturing a nanowire tunneling field effect transistor (TFET). In the method, the ZnO nanowire required is developed in a water bath without the need for high temperatures and high pressure, featuring a simple solution preparation, convenient development and low cost, as well as constituting MOS devices of vertical structure with nanowire directly, thus omitting the nanowire treatment in the subsequent stage. The present invention has the advantages of simple structure, convenient manufacturing, and low cost, and control of the nanowire channel developed and the MOSFET array with vertical structure made of it though the gate, so as to facilitate the manufacturing of large-scale MOSFET array directly.

2 Claims, 5 Drawing Sheets

NANOWIRE TUNNELING FIELD EFFECT TRANSISTOR WITH VERTICAL STRUCTURE AND A MANUFACTURING METHOD THEREOF

This application is claims benefit of Serial No. 201110309367.8, filed 13 Oct. 2011 in China and which application is incorporated herein by reference. To the extent appropriate, a claim of priority is made to the above disclosed application.

BACKGROUND OF THE INVENTION

1. Technical Field

The present invention belongs to the technical field of semiconductor devices and specifically relates to a tunneling field effect transistor (TFET) and a manufacturing method thereof.

2. Description of Related Art

The conventional metal-oxide-semiconductor transistor (MOS transistor), as shown in FIG. 1, including the following steps: firstly, form a dielectric gate layer 104 and a gate 105 usually formed of heavily-doped polycrystalline silicon on a substrate 101, and then form a source region 102 and a drain region 103 through the ion implantation method. After forming the source region and drain region by the ion implantation method, high-temperature (about 1000) annealing is required to activate the doping, so as to eliminate the lattice damage caused by ion implantation and reduce contact resistance. However, the processing at such high temperature will cause the secondary doping (boron or phosphorus) diffusion of the source region and drain region, which results in the change of the junction depth and channel length, and ultimately causes the device performance to deviate from the design standard. In particular, as the device characteristic dimension is reduced to below the technology node of 50 nanometers, the junction depth and channel length of the source region and drain region all enter the nanometer magnitude, while the ultra shallow junction of the source region and drain region cannot be realized through regular methods, which poses huge challenge to the processing of small-size devices. In addition, in order to overcome the short-channel effect of the MOS tube, TFET has been proposed and studied.

In recent years, since they are of the ideal system of physical and chemical properties determined by size and dimension, one-dimension nanometer structures, such as nanotubes, nanowires and nanobelts, have triggered wide research interest. Based on its unique physical and chemical properties, interests in one-dimensional semiconductor nanowire has gradually increased, and it is believed to be the possible basic component of integrated circuits in the future. Due to its properties similar to semiconductors, metallic oxide ZnO semiconductor nanowire has attracted wide attention. However, because of its inconvenient manufacturing, no method has been proposed to conduct convenient and large-scale array production. Moreover, it is also difficult to process it into planar device channels. Therefore, it is still a huge challenge to integrate ZnO nanowire into TFET as the channel.

BRIEF SUMMARY OF THE INVENTION

In view of this, the present invention aims at putting forward a TFET based on ZnO nanowires and a manufacturing method therefor, thus realizing the large-scale array production of TFET with ZnO nanowire as the channel.

To realize the objective of the present invention above, a nanowire TFET with vertical structure is put forward in the present invention, comprising:

a heavily-doped p-type semiconductor substrate;
a seed crystal layer formed on the substrate;
a nanowire with vertical structure formed on the seed crystal layer;
a gate dielectric layer which is located around the nanowire channel formed by covering the seed crystal layer;
a polycrystalline silicon gate formed by covering the gate dielectric layer;
further, the top of the nanowire is used as the drain of the device, which is extracted as metal electrode by contacting with metal; the heavily-doped semiconductor substrate is used as the source.

The present invention has also put forward a method for manufacturing a nanowire TFET with vertical structure mentioned above, comprising the following steps:

provide a heavily-doped p-type semiconductor substrate;
develop a ZnO gate seed crystal layer on a specific region of the substrate through the lift-off process or lithography/etching process;
develop a ZnO nanowire in water bath using the gate seed crystal layer formed as the solid-state source;
form a first insulation film around the ZnO nanowire and the substrate;
form a heavily-doped polycrystalline silicon layer through deposition on the first insulation film;
etch the formed polycrystalline silicon layer and the first insulation film to expose the ZnO nanowire;
define a gate electrode pattern on the formed polycrystalline silicon layer;
form a second insulation film, and etch the second insulation film to expose the top of the ZnO nanowire;
use the top of the exposed ZnO nanowire as the drain of the device, which contacts with metal to form a drain electrode;
form a third insulation film, and etch the third insulation film to form a through-hole, and use a layer of metal to extract the drain electrode and gate electrode.

Furthermore, the substrate is an organic substrate of silicon, silicon on an insulator (SOI), or polyimide (PI). The first insulation film is of $SiO_2$ or high dielectric constant materials such as $HfO_2$. The second and third layers of insulation film are of silicon dioxide or silicon nitride.

The method for manufacturing a nanowire TFET with a vertical structure put forward by the present invention has the following advantages:

1. In the present invention, the ZnO nanowire required is developed in a water bath without the need for high temperatures and high pressure, featuring simple solution preparation, convenient development and low cost as well as constituting TFET devices of vertical structure with nanowire directly, thus omitting the nanowire treatment in the subsequent stage.

2. The present invention has the advantages of simple structure, convenient manufacturing and low cost, and control of the nanowire channel developed and the TFET array with a vertical structure made though the gate, so as to facilitate the manufacturing of large-scale MOSFET arrays directly.

DETAILED DESCRIPTION OF THE INVENTION

Figure 1:
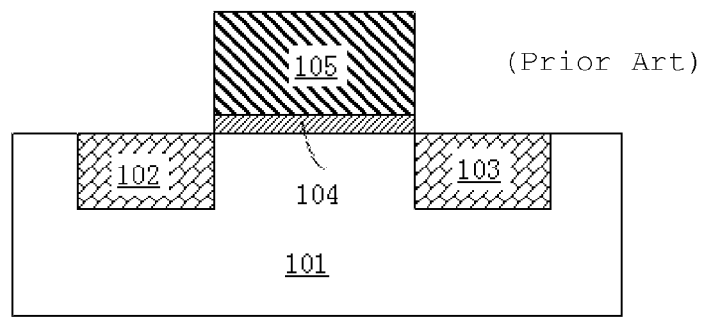
FIG. 1 is the schematic diagram of the conventional TFET structure.

An exemplary embodiment of the present invention is further detailed herein by referring to the drawings. In the drawings, the thicknesses of the layers and regions are either zoomed in or out for the convenience of description, so they shall not be considered as the true size. Although these drawings cannot accurately reflect the true size of the device, they still reflect the relative positions among the regions and composition structures completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "substrate" used in the following description can be considered as a semiconductor substrate during manufacturing process, and other film layers prepared on it may also be included.

Figure 2:
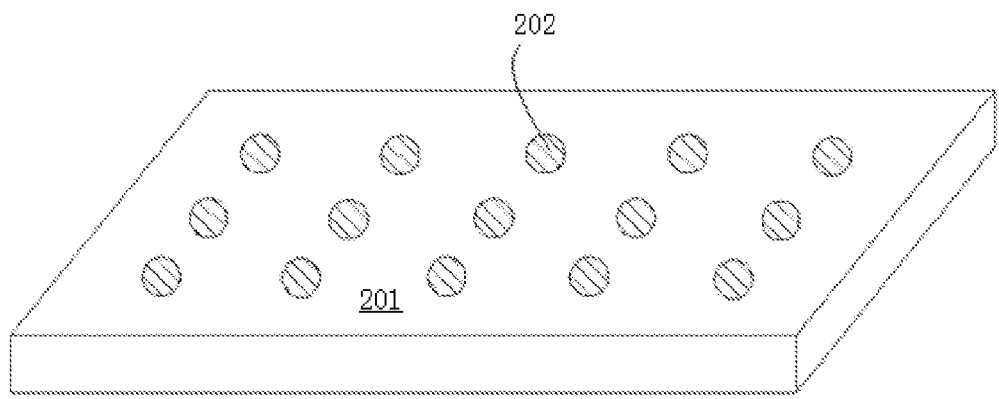
FIGS. 2-9 are the process flow diagrams of an embodiment of the method for manufacturing a nanowire TFET with vertical structure put forward by the present invention.

Firstly, provide a silicon substrate or an organic substrate 201, and then develop a ZnO gate seed crystal layer 202 with a thickness of several dozens of nanometers in a specific region on the provided substrate 201 through the lift-off process or lithography and etching process, as shown in FIG. 2. Next, develop a ZnO nanowire 203 in water bath under normal pressure and a temperature of 90° C. using the formed ZnO gate seed crystal layer as the solid-state source, as shown in FIG. 3a, wherein FIG. 3b is the A-direction view of the structure shown in FIG. 3a.

Figure 4:
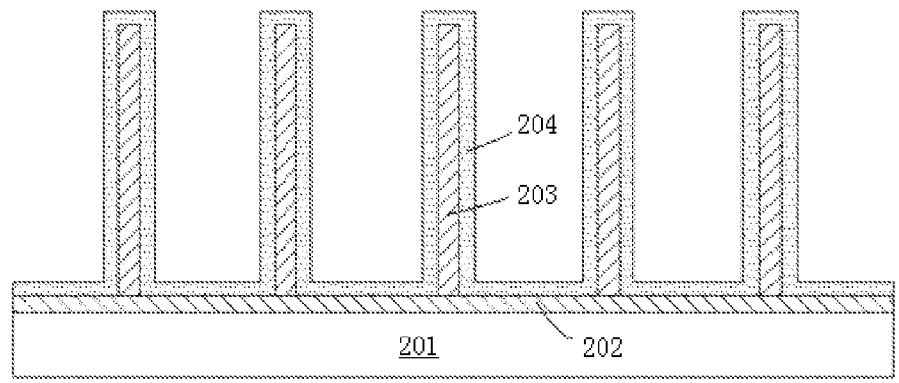

Next, deposit a high dielectric constant dielectric layer 204 around the ZnO nanowire, such as that of $HfO_2$, as shown in FIG. 4, and then conduct annealing.

Figure 5:
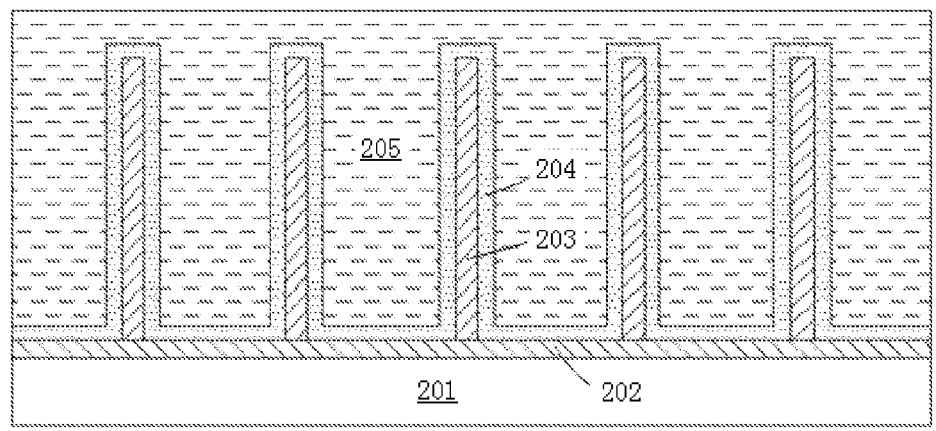
Figure 6:
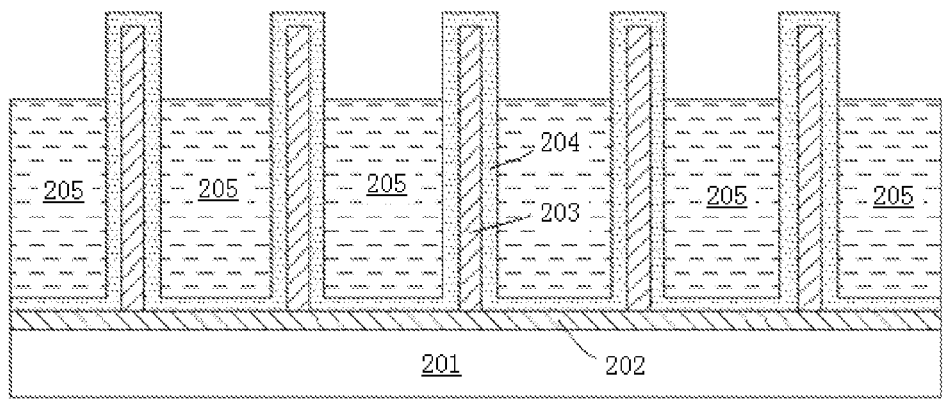

Next, on the $HfO_2$ dielectric layer 204, deposit a heavily-doped polycrystalline silicon layer 205 and conduct planarization treatment, as shown in FIG. 5. Then use the hydrofluoric acid to etch the polycrystalline silicon layer on the surface until the ZnO nanowire and $HfO_2$ dielectric layer are exposed, and during this process, due to its corrosion-resistance feature, the $HfO_2$ dielectric layer can protect the ZnO nanowire from being corroded, as shown in FIG. 6.

Figure 3A:
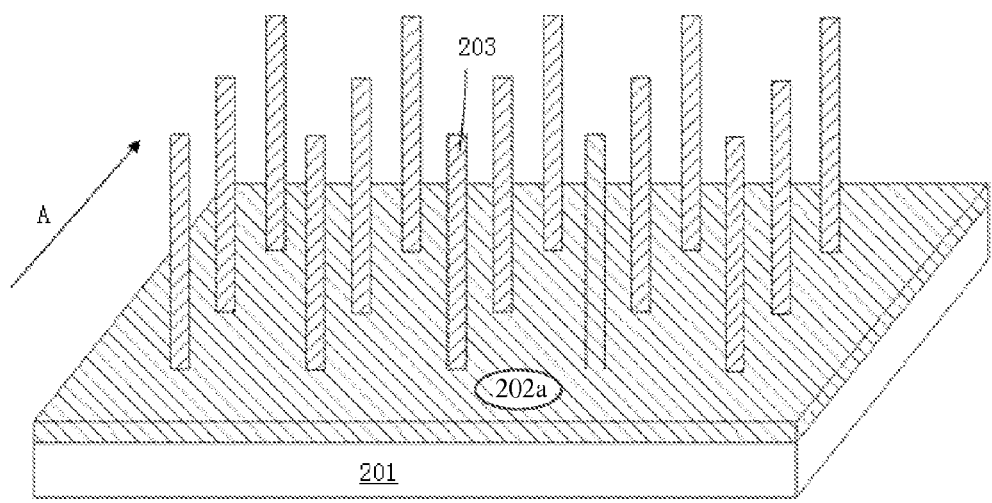
Figure 3B:
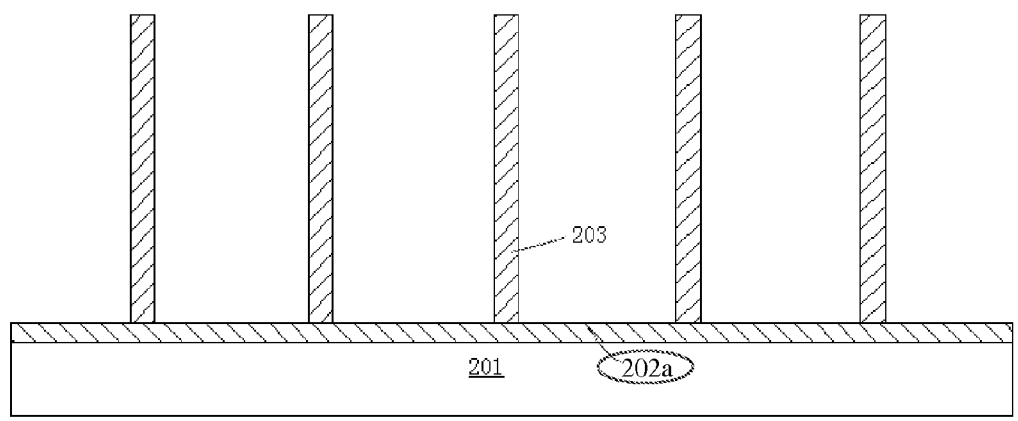
Figure 7A:
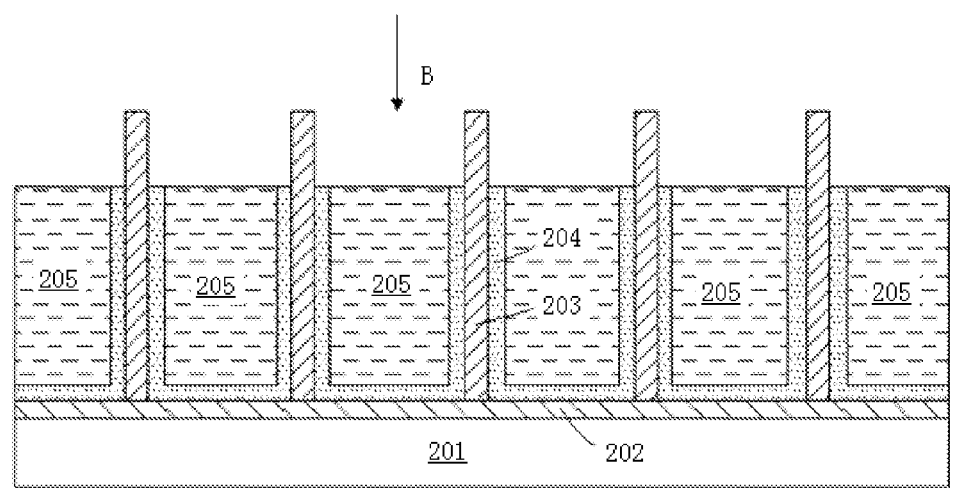
Figure 7B:
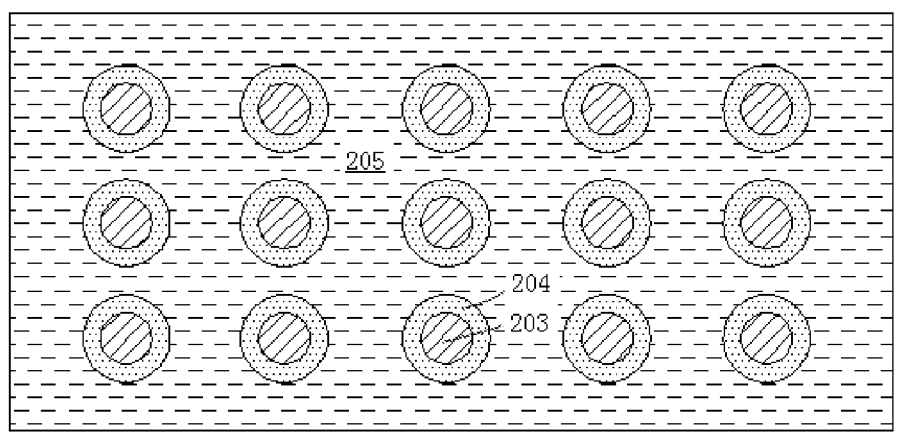
Figure 8:
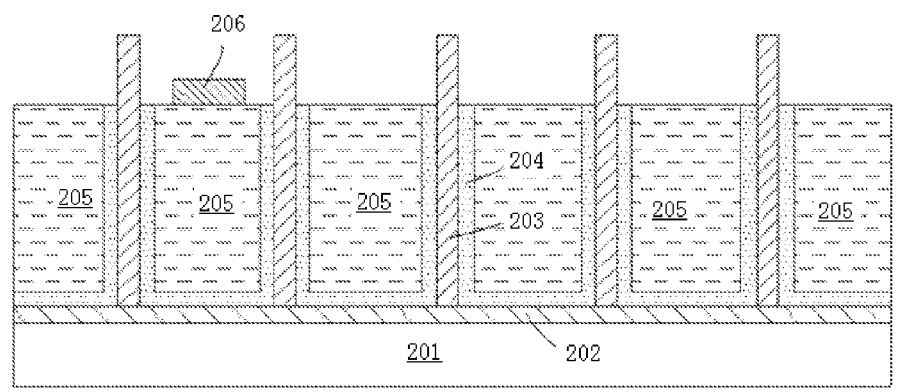

Afterwards, etch the nanowire top of the $HfO_2$ dielectric layer through the plasma etching technology until the nanowire is exposed, as shown in FIG. 7a, and FIG. 7b is the B-direction view of the structure shown in FIG. 3a. Then define a gate electrode pattern 206, as shown in FIG. 8.

Figure 9:
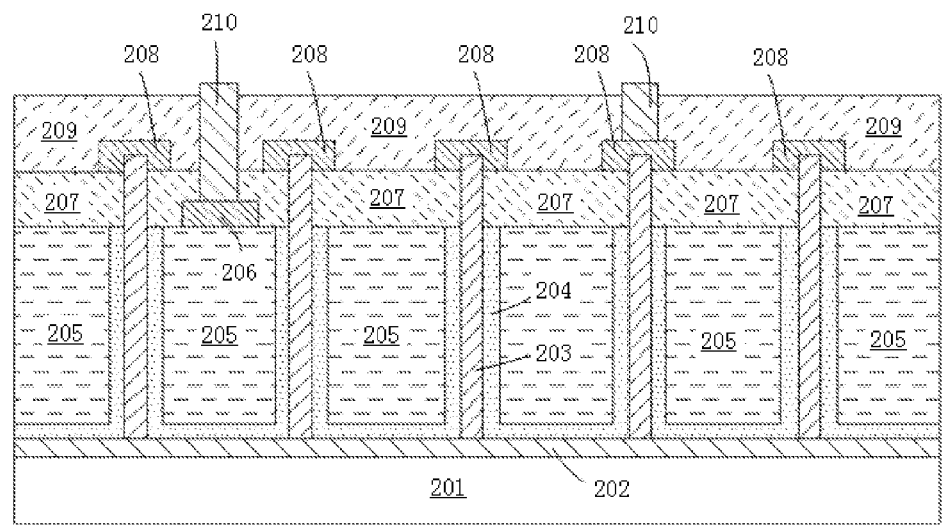

Finally, deposit a first oxide layer 207, such as a silicon dioxide layer, and etch the silicon dioxide 207 until the top of the ZnO nanowire is exposed; then use the top of the ZnO nanowire as the drain of the device, which contacts with Ti/Au metal and forms a drain electrode 208; next, form a second layer of silicon dioxide 209, and etch the formed silicon dioxide layers 207 and 209 to form a through-hole; afterwards, deposit a layer of metal 210 to extract the gate electrode and drain electrode, and level it by means of the chemical and mechanical polishing technique, as shown in FIG. 9.

It shall be pointed out that the substrate in FIG. 9 is of p-type heavy doping and a TFET source, while the ZnO itself is an n-type semiconductor and the drain on the top is an n-type semiconductor. Therefore, it is significantly different from the traditional MOS transistor, and application of this kind of TFET device can significantly optimize the short-channel effect.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for manufacturing a nanowire TFET with vertical structure, comprising the following steps:
   providing a heavily-doped p-type semiconductor substrate;
   developing a ZnO gate seed crystal layer on a specific region of the substrate;
   developing a ZnO nanowire in water bath using the gate seed crystal layer;
   forming a first insulation film around the ZnO nanowire and the substrate;
   forming a heavily-doped polycrystalline silicon layer through deposition on the first insulation film;
   etching the formed polycrystalline silicon layer and the first insulation film to expose the ZnO nanowire;
   defining the gate electrode pattern on the formed polycrystalline silicon layer;
   forming a second insulation film, and etching the second insulation film to expose the top of the ZnO nanowire;
   forming a metal drain electrode onto the top of the exposed ZnO nanowire;
   forming a third insulation film, and etching the third insulation film to form a through-hole, and
   forming a layer of metal in the through-hole to contract the drain electrode and gate electrode.

2. The nanowire TFET with vertical structure according to claim 1, wherein the first insulation film is formed of $SiO_2$ or $HfO_2$.

* * * * *